Dec. 31, 1968 C. KAMNITSIS 3,419,813

WIDE-BAND TRANSISTOR POWER AMPLIFIER USING A SHORT IMPEDANCE MATCHING SECTION

Filed June 22, 1967

INVENTOR
CONSTANTINE KAMNITSIS

BY Edward J. Norton

ATTORNEY

3,419,813
WIDE-BAND TRANSISTOR POWER AMPLIFIER USING A SHORT IMPEDANCE MATCHING SECTION

Constantine Kamnitsis, Oceanport, N.J., assignor to Radio Corporation of America, a corporation of Delaware Filed June 22, 1967, Ser. No. 648,127
10 Claims. (Cl. 330—30)

ABSTRACT OF THE DISCLOSURE

A wide-band transistor power amplifier is provided using a short, impedance matching, strip transmission line section. The section is made to match the wide-band, high input impedance of a signal source coupled to one end of the section with the real, low input impedance of a high frequency power transistor coupled at the opposite end of the section. The width of the section changes exponentially between the opposed ends so as to provide with the transistor power amplifiaction of a wide-band, high frequency input signal supplied by the source.

Figure 2:
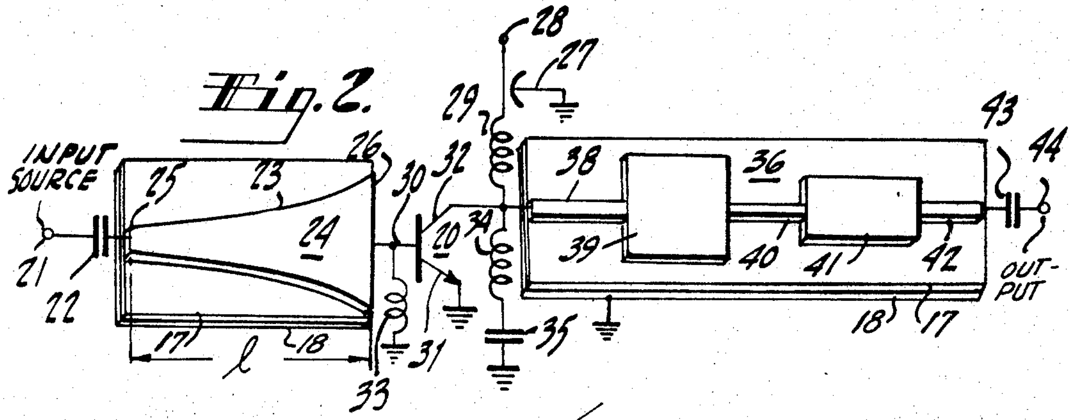

The invention herein described was made in the course or under a contract or subcontract thereunder with the Department of the Air Force.

*Background of invention*

This invention relates to impedance matching devices for matching the high input impedance of a signal source to the relatively low input impedance of a high frequency power transistor to provide wide-band power amplification.

Wide-band operation of high power, high frequency transistors has always been a difficult problem. The intrinsic characteristic of a transistor together with its parasitic elements are the main limiting factors. For wide-band operation, the transistor should have high gain-bandwidth product ($F_t$) and a very much lower base-to-collector capacitance $C_{bc}$. The most critical parasitics are the emitter lead inductance $L_e$ and the base lead inductance $L_b$. The emitter lead inductance in series with intrinsic structure will increase the input Q and reduce the bandwidth further. The additional parasitic inductance also enhances the variation of transistor input and output impedances with frequency. In order to obtain uniform gain over a wide frequency range, the input and output network must be capable of compensating for the variations of the transistor dynamic input impedance and collector load impedance. In addition these circuits should provide a good match at the highest part of the frequency band and introduce mismatch at the lower part of the band where the gain of the transistor is higher.

In the prior art, one apporach to obtain uniform gain over a wide frequency range has been to incorporate with the transistor passive input and output circuits. At frequencies above 80 mHz (megahertz), these transformers cease to be useful. Conventional tapered transmission lines are also impractical in the megahertz region of the frequency spectrum due to the required long length and matching of the low input impedance characteristics of the high power high frequency transistors. Considerable attention has also been devoted in the last few years toward integration of circuits in the microwave region. It is therefore also desirable to develop a wide band impedance matching section compatible with integrated structures.

It is an object of this invention to provide an improved wide band impedance matching section for high power, high frequency transistors.

It is another object of this invention to provide an improved wide band impedance matching section compatible with integrated structure.

It is a further object of this invevntion to provide an improved wide band, high frequency transistor power amplifier.

*Summary of the invention*

Briefly, the above objects are obtained in accordance with the present invention through the use of a section of a type of strip transmission line sometimes referred to as microstrip. The transmission line is constructed of a planar conductor spaced parallel to a narrower conductor by a slab or substrate of dielectric material. The narrower conductor has a width at one end adapted so that this end of the transmission line matches the high output impedance of a signal source. The narrower conductor has a width at the opposite end of the section adapted so that this end of the transmission line matches the low real input impedance of a high frequency power transistor. The width of the narrower conductor changes exponentially between its respective opposite ends so that the transmission line section provides a proper impedance match between the wide-band, high impedance signal source and the low input impedance of the power transistor upon coupling the transmission line section between the source and the power transistor.

*Description of the preferred embodiments*

Figure 1:
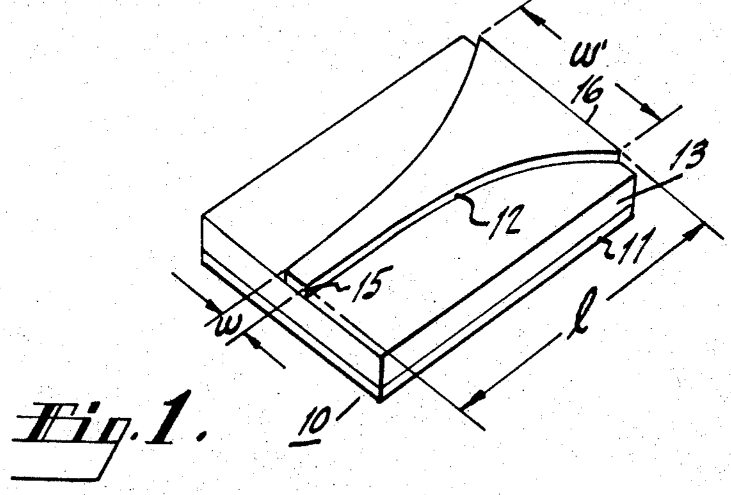
Figure 3:
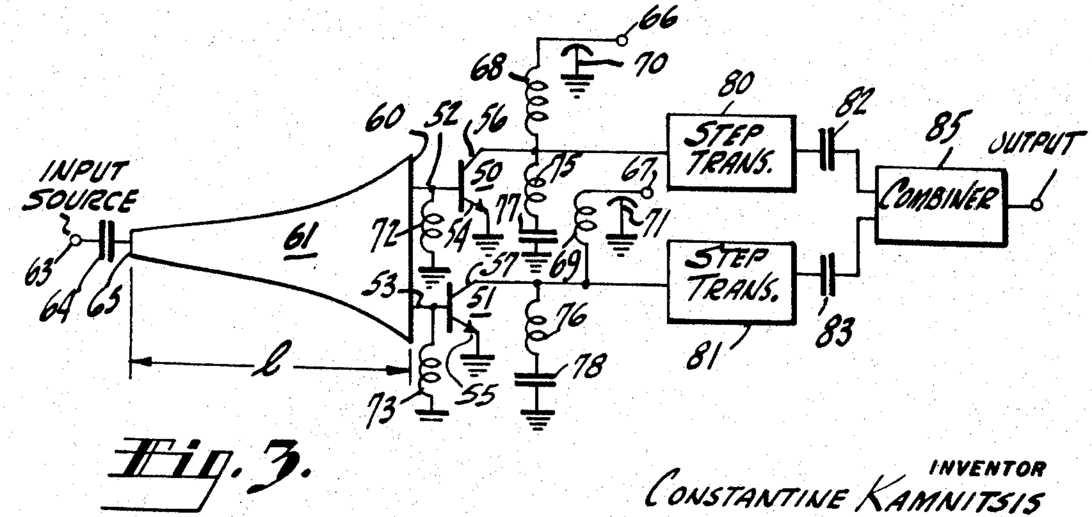

The invention will be further described in connection with the accompanying drawings in which:

FIGURE 1 is a circuit diagram of an impedance matching section in accordance with an embodiment of the present invention, FIGURE 2 is a circuit diagram of a high frequency transistor power amplifier providing power amplification over a wide-band of frequencies in accordance with a further embodiment, FIGURE 3 is a circuit diagram of a high power high frequency transistor amplifier using a plurality of transistors in accordance with another embodiment of the present invention.

Referring to the drawings, there is shown in FIGURE 1 an impedance matching section 10. The transmission line section 10 comprises a first planar conductor 11 usually placed at zero or ground potential and a second narrower conductor 12 spaced parallel to the wide planar conductor 11 by a slab or substrate of dielectric material 13. The length "*l*" of the narrower conductor 12 is made less than one quarter wavelength at the mid-frequency of the operating frequency band. In the described embodiments to follow, the length "*l*" of the conductor 12 is made to be about one eighth of a wavelength at the mid-frequency of the operating frequency band. A relatively high input impedance source, such as 50 ohms in the embodiments to be described is coupled between the narrow conductor 12 and planar conductor 11 at one end 15 of the transmission line section 10. The width W of the narrow conductor 12 is dimensioned at end 15 so as to match to the 50-ohm impedance source. The low impedance input of an RF power transistor, having for example a real input impedance of 2 ohms, is coupled at the opposite end 16 of transmission line section 10 between narrow conductor 12 and planar conductor 11. The width W' of the narrow conductor 12 at the opposite end 16 is made wider so as to match to the low input impedance of the power transistor. The narrow conductor 12 tapers exponentially between the end points 15 and 16 to provide a very short exponentially tapered, impedance matching microstrip transmission line section. The above described transmission line has been tested with the newly developed high frequency power transistors and together this combination provides superior wide-band, high frequency power amplification. An explanation that may be used to show why such wide-band amplification takes place is that both the real and the imaginary components of the high frequency power transistors are such as to be matched by the above described impedance matching device.

FIGURE 2 is a circuit diagram of a wide-band amplifier operable between 300 and 430 mHz in accordance with one embodiment of this invention. The entire amplifier shown in FIGURE 2 is preferably constructed on a $\frac{1}{32}$ inch thick dielectric board 17 shown in two pieces with a planar or ground conductor, 18 shown in two pieces on one side. A relatively narrow conductor 24 on the opposite side of one piece of dielectric board 17 forms the type of strip transmission line described in connection with FIG. 1. The dielectric constant of the board used in the example shown in FIGURE 2 was 2.6. A 300 to 430 mHz input signal source is connected to terminal 21. The input signal is coupled through coupling capacitor 22 and is applied to the end 25 of the impedance section 24 as shown in FIG. 2. The width of the narrower conductor 24 is made so that the transmission line section matches the output impedance of the wide-band input signal source. With an input impedance of 50 ohm, for example, the width at end 25 of the narrow conductor 24 is made 0.086-inch wide. The length of the section along the dimension "$l$" is 2.6 inches. The wider or broader end 26 of the narrow conductor 24 is made wide enough to match the real input impedance of a transistor 20. By way of example, the transistor 20 may be an RCA TA2909 RF power transistor having an input impedance of $2+j4$ ohms. The width at end 26 of the narrow conductor 24 was in the example given 2.19 inches. The width of the narrow conductor 24 changes exponentially between end points 25 and 26 as shown by the taper 23.

The output of the matching section is coupled across the input of the transistor 20. The base 30 of transistor 20 is coupled to the broader end 26 of the narrow conductor strip 24. The emitter 31 is coupled to zero or ground potential. The collector 32 is connected to the positive terminal of a suitable source 28 (in the example a +28 volts source) of unidirectional potential, not shown, over a path including RF choke coil 29 and feed-through RF bypass capacitor 27. The output capacitance of transistor 20 is tuned out by an inductor 34 and bypass capacitor 35. The base 30 of transistor 20 is placed at DC zero or ground potential through RF choke coil 33.

The output of transistor 20 at collector 32 is coupled to a second strip transmission line comprising a narrow conductor spacer by a $\frac{1}{32}$ inch dielectric slab 17, from a planar or ground conductor 18. The second strip transmission line forms a step transformer 36 having five sections each of varying width. In the above example each narrow conductor section is 1.1-inch long. The first narrow conductor section 38 is 0.086 inch wide or a 50 ohm section, the second section 39 is 0.5 inch wide or 11 ohm section, the third section 40 is 0.03 inch wide or 90 ohm section, the fourth section 41 is 0.3 inch wide or 20 ohm section, and the fifth section 42 is 0.086 inch wide or 50 ohm section. The output of the fifth section 42 of step transformer 36 is coupled through a capacitor 43 to an output terminal 44. The dielectric slab with the planar or ground conductor, not shown, upon which the transistor 20, associated circuitry and step transformer 36 are mounted may be an extension of the first transmission line section 24. The transformer 36 is a short step Chebyshev impedance transformer wherein the length of each section is approximately one sixteenth of a wavelength in the dielectric medium. The step transformer 36 described in connection with FIGURE 2 has a center frequency of approximately 400 mHz. Wide-band power amplication with 4 watts constant input power was obtained. Only one decibel variation of power from 300 to 430 mHz with a maximum output power of 21 watts was obtained. The collector efficiency ranged from 55 percent at 300 mHz to maximum of 70 percent at 400 mHz.

FIGURE 3 is a circuit diagram of a wide-band power amplifier wherein two transistors 50, 51 are connected in parallel. The separate transistors 50, 51 may be, for example, RCA type TA2909. The parallel transistors 50, 51 are each biased in a manner similar to that of transistor 20 in FIGURE 2. The respective bases 52, 53 of the transistors 50, 51 are coupled to the wide end 60 of narrower conductor 61. The respective emitters 54, 55 are each coupled to zero or ground potential. The respective collectors 56, 57 are each coupled to a separate suitable source 66, 67 of unidirectional potential, not shown, over separate paths including RF chokes 68, 69 and corresponding feed through capacitors 70, 71. The bases 52, 53 are placed at DC zero or ground potential through RF choke coils 72, 73. The output capacitance of transistors 50, 51 is tuned out through inductors 75, 76 and RF bypass capacitors 77, 78. An input signal from a 50 ohm input source impedance and of a frequency between 340–430 mHz is applied to the input terminal 63 and is coupled through capacitor 64 and across the impedance section by coupling to the narrow end 65 of the narrower conductor 61. Only the narrower conductor 61 of the impedance section is shown in the schematic of FIGURE 3, the impedance section being similar to that shown in FIGURE 1 with the input signal being applied between the narrow and planar conductors. The amplifier shown in FIGURE 3 is preferably constructed on $\frac{1}{32}$ inch thick dielectric board, not shown, with a planar conductor, not shown, on one side coupled to zero or ground potential and the narrow conductor 61 on the opposite side to form a type of strip transmission line. The dielectric constant of the board used in an amplifier constructed in the manner of that shown in FIGURE 3 was 2.6. The length of the narrow conductor 61 was approximately 2.6 inches. The wider or broader end 60 of the narrow conductor 61 using two RCA TA2909 transistors was 3.45 inches. The width of the narrow conductor 61 changes exponentially between the end points 65 and 60.

The respective collectors 56, 57 of transistors 50, 51 are each coupled over separate paths through identical step transformers 80, 81. The step transformers 80, 81 are identical to the transformer 36 shown in FIGURE 2 and described in connection therewith. The output of transformers 80, 81 are coupled through coupling capacitors 82, 83 to a combiner 85 where the output of transistors 50, 51 are added together. Wide-band power amplification in the construction outlined above with 9.5 watt constant input power obtained. Only 2 decibel variation of power between 340 to 430 mHz with a maximum power output of 38 watts was obtained. The overall efficiency ranged from 36 percent at 340 mHz to 57 percent at 400 mHz.

What is claimed is:

1. A short impedance matching section for impedance matching over a relatively wide band of operating frequencies a high impedance signal source to a low input impedance high frequency power transistor comprising:
   - a first planar conductor,
   - a second conductor narrower than said first planar conductor,
   - a piece of dielectric material interposed between said conductors to maintain a close dielectrically spaced parallel relation,
   - said narrow conductor having an electric length less than one quarter wavelength at the mid-frequency of the operating frequency band with a width at a first end matching the impedance of said signal source and a width at the opposite end matching the real input impedance of said transistor.

2. The combination as claimed in claim 1 wherein the width of said narrow conductor changes exponentially between said first end and said opposite end.

3. The combination as claimed in claim 2 wherein the electrical length of said narrow conductor is approximately one eighth of a wavelength at the mid-frequency of the operating frequency band.

4. A wide-band, high frequency, transistor power amplifier comprising:

a wide-band high frequency high impedance source, a high frequency power transistor having a low real input impedance, means for biasing said transistor, a strip transmission line including a first broad planar conductor, a narrow conductor parallel to said planar conductor, and a piece of dielectric material spacing said planar conductor and said narrower conductor, the width of said narrower conductor being determined by an exponential transformation in configuration to match said high impedance source coupled at one end of said transmission line to said low real input impedance of said transistor coupled at the opposite end of said line, means coupling said high impedance source to said one end of said transmission line and coupling the input of said transistor to said opposite end of said transmission line, means responsive to the output of said transistor for tuning the output of said transistor to a selected frequency.

5. The wide-band, high frequency power transistor amplifier as claimed in claim 4 wherein said transistor has an input, an output and a common electrode, said input electrode being coupled to said opposite end and said output electrode being coupled to said tuning means, said common electrode being coupled to ground potential and said first planar conductor also being coupled to said ground potential.

6. The wide-band, high frequency power transistor amplifier claimed in claim 4 wherein said narrower conductor has an electrical length less than one quarter wavelength at the mid-frequency of the operating band of frequencies.

7. The wide-band, high frequency power transistor amplifier claimed in claim 4 wherein said means for tuning the output of said transistor includes a strip transmission line having a plurality of narrow conductor sections of varying width spaced from a broad planar conductor coupled to ground potential.

8. The wide-band, high frequency power transistor amplifier claimed in claim 4 wherein said narrower conductor has an electrical length approximately one eighth of a wavelength at the mid-frequency of the operating band of frequencies.

9. A wide-band RF power transistor amplifier comprising:

a wideband high frequency power signal source having a relatively high output impedance, a plurality of high frequency power transistors having a combined relatively low input impedance, means for biasing said transistors, a strip transmission line including a first broad planar conductor, a narrow conductor parallel to said planar conductor, a flat board of dielectric material spacing said planar conductor and said narrower conductor, the width of said narrower conductor matching said high impedance source at one end of said transmission line by an exponential change in shape to said low real input impedance of said plurality of transistors at the opposite end of said line, means coupling said high impedance source to one end of said transmission line and for coupling said opposite end of said transmission line to the input of each of said plurality of transistors in parallel, means coupled to the output of each of said transistors for tuning the output therefrom.

10. The wideband RF power transistor amplifier claimed in claim 9 wherein said tuning means includes a plurality of strip transmission line step transformers each individually coupled to the output of one of said transistors and includes a means responsive to said plurality of step transformers for combining the amplifier outputs of said parallel transistors.

No references cited.

JOHN KOMINSKI, *Primary Examiner.*

U.S. Cl. X.R.

330—31, 53, 56, 185; 333—34, 84